United States Patent
Kimata

(10) Patent No.: US 8,567,586 B2
(45) Date of Patent: Oct. 29, 2013

(54) CONVEYING SYSTEM HAVING ENDLESS DRIVE MEDIUM, METHOD FOR IDENTIFYING CARRIER THEREOF, AND CARRIER

(75) Inventor: Tomoya Kimata, Inuyama (JP)

(73) Assignee: Murata Machinery, Ltd., Kyoto (JP)

(*) Notice: Subject to any disclaimer, the term of this patent is extended or adjusted under 35 U.S.C. 154(b) by 80 days.

(21) Appl. No.: 13/322,591

(22) PCT Filed: Jun. 2, 2009

(86) PCT No.: PCT/JP2009/060075
§ 371 (c)(1),
(2), (4) Date: Nov. 28, 2011

(87) PCT Pub. No.: WO2010/140220
PCT Pub. Date: Dec. 9, 2010

(65) Prior Publication Data
US 2012/0067695 A1    Mar. 22, 2012

(51) Int. Cl.
*B65G 37/00* (2006.01)
(52) U.S. Cl.
USPC ............ 198/358; 198/349; 198/349.5
(58) Field of Classification Search
USPC ............ 198/358, 349, 349.5, 346.1, 346.2
See application file for complete search history.

(56) References Cited

U.S. PATENT DOCUMENTS

| | | | |
|---|---|---|---|
| 3,834,315 A * | 9/1974 | Warner | 198/358 |
| 4,589,184 A | 5/1986 | Asano et al. | |
| 4,805,759 A | 2/1989 | Rochet et al. | |
| 5,575,375 A * | 11/1996 | Sandusky et al. | 198/358 |
| 5,651,798 A | 7/1997 | Conboy et al. | |
| 6,009,991 A * | 1/2000 | Anderson | 198/349 |
| 7,234,584 B2 | 6/2007 | Rice et al. | |
| 7,930,061 B2 * | 4/2011 | Rice et al. | 700/218 |
| 2003/0029696 A1 * | 2/2003 | Hirata et al. | 198/358 |
| 2004/0062633 A1 | 4/2004 | Rice et al. | |

FOREIGN PATENT DOCUMENTS

| | | |
|---|---|---|
| JP | 61-150878 A | 7/1986 |
| JP | 62-502503 A | 9/1987 |
| JP | 02-023109 A | 1/1990 |
| JP | 05-008854 A | 1/1993 |
| JP | 2004-134765 A | 4/2004 |

OTHER PUBLICATIONS

Official Communication issued in corresponding European Patent Application No. 09845505.8, mailed on Sep. 20, 2012.
Official Communication issued in International Patent Application No. PCT/JP2009/060075, mailed on Jul. 21, 2009.
Kimata, "Conveying System Having Endless Drive Medium and Method for Delivering/Receiving Article Therein", U.S. Appl. No. 13/322,589, filed Nov. 28, 2011.
Kimata, "Conveying System Having Endless Drive Medium and Conveying Method", U.S. Appl. No. 13/322,644, filed Nov. 28, 2011.

* cited by examiner

*Primary Examiner* — James R Bidwell
(74) *Attorney, Agent, or Firm* — Keating & Bennett, LLP

(57) ABSTRACT

In a transport system, a plurality of carriers are attached to an endless belt configured to rotate in a circulating manner. The carriers hold articles for transportation. Each of the carriers includes an identification target for carrier identification. A plurality of stations are provided, and each of the stations includes a hand configured to load articles to or unload articles from the carriers and a sensor configured to detect the identification target at a predetermined position upstream of the hand along a rotation direction of the belt. The carrier is identified, and an appearance of the carrier is recognized based on a signal from the sensor to operate the hand for a desired carrier. The carrier can be identified using the sensor to detect the position of the carrier.

6 Claims, 11 Drawing Sheets

F I G. 2
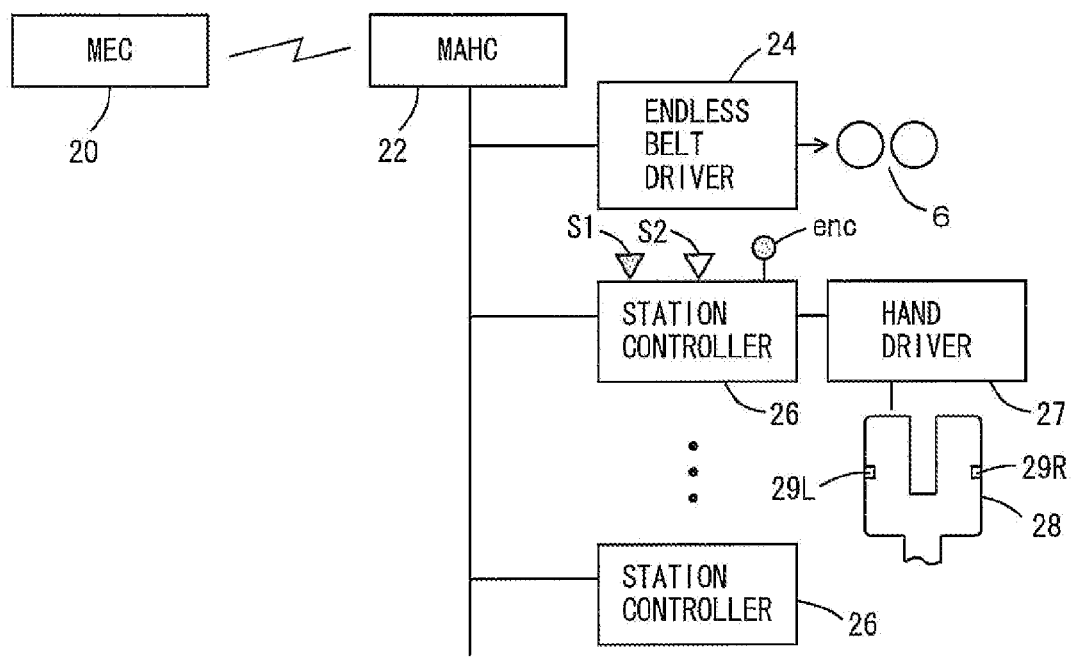

8

8

CONVEYING SYSTEM HAVING ENDLESS DRIVE MEDIUM, METHOD FOR IDENTIFYING CARRIER THEREOF, AND CARRIER

BACKGROUND OF THE INVENTION

1. Field of the Invention

The present invention relates to a transport system that transports semiconductor substrates or other articles by a carrier attached to an endless driving medium. In particular, the present invention relates to a technique of identifying a carrier holding articles such as semiconductor substrates or the like.

2. Description of the Related Art

According to U.S. Pat. No. 7,234,584, a plurality of carriers are attached to an endless belt, and the endless belt rotates in a circulating manner. Each of the carriers has a support surface for supporting a flange or the like of a semiconductor cassette, and the cassette is loaded or unloaded using a hand of a station. Transport systems have controllers for controlling positions of the carriers. Carriers as targets of loading and unloading are designated in stations. For identification of a carrier at the station, an ID should be attached to the carrier, and an ID reader should be provided at the station. However, in this case, the ID reader is required for carrier identification.

SUMMARY OF THE INVENTION

Preferred embodiments of the present invention make it possible to identify a carrier via a sensor that performs position detection in a transport system including an endless driving medium and a plurality of carriers.

A transport system according to a preferred embodiment of the present invention includes an endless driving medium configured to rotate in a circulating manner; a plurality of carriers each including an identification target (mark) for carrier identification, configured to hold articles, and attached to the endless driving medium; and a plurality of stations each including a hand configured to load articles to or unload articles from the carriers, and a sensor configured to detect the identification target at a predetermined position upstream of the hand along a rotation direction of the endless driving medium for outputting a detection signal of the carrier and an identification signal of the carrier.

A method of identifying a carrier in a transport system according to another preferred embodiment of the present invention includes the steps of attaching a plurality of carriers configured to hold articles and each including an identification target (mark) for carrier identification, to an endless driving medium configured to rotate in a circulating manner; providing a plurality of stations each including a hand configured to load articles to or unload articles from the carriers and a sensor configured to detect the identification target at a predetermined position upstream of the hand along a rotation direction of the endless driving medium; and identifying a carrier and recognizing an appearance of the carrier at a predetermined position based on a signal from the sensor to operate the hand for a desired carrier.

A carrier according to a preferred embodiment of the present invention preferably includes a carrier body that supports an article; and an attachment provided at an upper portion of the carrier body for attachment to an endless driving medium.

The carrier is identifiable based on a width of the attachment along a moving direction of the endless driving medium.

Preferably, the detection signal of the carrier is used as a timing signal to start an unloading operation or an unloading operation of the hand.

More preferably, the identification target is an attachment configured to attach the carrier to the endless driving medium, and for identification of the carrier, attachments having different widths are provided for the plurality of carriers along the rotation direction of the endless driving medium.

Particularly preferably, the attachment is attached to a lower end of the endless driving medium, and a carrier body of the carrier is provided with a gap in a height direction between the lower end of the endless driving medium and the carrier body of the carrier.

The sensor is configured to detect the attachment at a height position between the lower end of the endless driving medium and an upper portion of the carrier body.

Further, preferably, an identification target that is different from other identification targets is provided for every predetermined number of carriers, and the carrier is detected by counting a number of identification targets detected after detection of the different identification target. In this regard, as for counting of the identification targets, any method can be adopted. For example, the different identification target is counted as "0" and the next identification target is counted as "1" or the different identification target is counted as "1" and the next identification target is counted as "2".

In this specification, description regarding the transport system is directly applicable to the transport method and the carrier used in the transport system.

In various preferred embodiments of the present invention, appearance of a carrier at a predetermined position can be recognized, and the carrier can be identified by detecting an identification target (mark) by a sensor. In this manner, a single sensor can be used for both of carrier identification and detection of the carrier position. Further, it is not essential to use different signals for the identification signal of the carrier and the detection signal of the carrier. For example, the identification signal may be added to the detection signal to define one signal.

By identifying the carrier using different widths of attachments to attach the carriers to the endless driving medium, carrier identification can be performed easily.

In particular, by providing a gap in a height direction between the lower end of the endless driving medium and a carrier body of the carrier to detect the width of the attachment along the rotation direction of the endless driving medium at the height of the gap, the identification target can be detected without being obstructed by articles during transportation.

By providing an identification target that is different from other identification targets for every predetermined number of carriers, and counting a number of identification targets after detection of the different identification target, whether carrier identification can be performed correctly or not can be checked at intervals of the predetermined number of carriers.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a block diagram showing a control system in a preferred embodiment of the present invention.

DETAILED DESCRIPTION OF THE PREFERRED EMBODIMENTS

Figure 1:
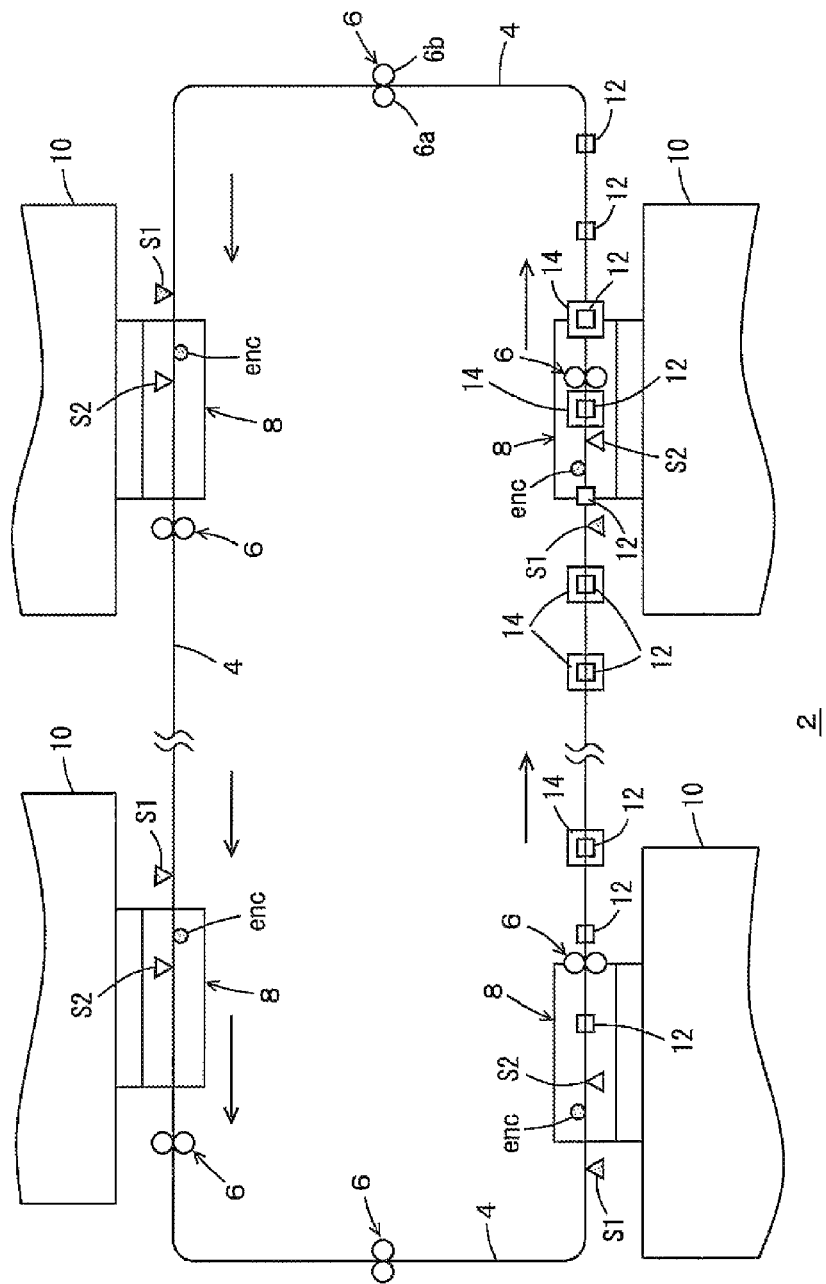
FIG. 1 is a plan view showing a layout of a transport system in a preferred embodiment of the present invention.

Hereinafter, preferred embodiments of the present invention will be described.

FIGS. 1 to 11 show preferred embodiments and modifications thereof. In the drawings, a reference numeral 2 denotes a transport system that rotates an endless belt 4 in a circulating manner. Reference numerals 6 denote pulleys that drive the endless belt 4. Reference numerals 6a, 6b denote individual pulley elements. Instead of the belt 4, a chain, a wire, a rope or the like may be used. The belt 4 is rotated in a fixed direction, and a plurality of stations 8 are provided along the belt 4. Buffers (not shown) and processing tools 10 or the like are connected to each station 8. For example, carriers 12 are attached to the belt 4 at constant intervals for transportation of cassettes 14 containing semiconductor substrates or other articles. Any type of articles can be transported.

FIG. 2 shows a control system of the transport system. A reference numeral 20 denotes a manufacturing execution controller. The manufacturing execution controller 20 controls processing tools or the like, and requests a material handling controller 22 to transport the cassettes. The material handling controller 22 controls an endless belt driver 24 and station controllers 26. The station controller 26 is provided for each station. The endless belt driver 24 drives the endless belt 4 at a constant velocity. Inputs to the station controller 26 are transportation instructions from the material handling controller 22. The transportation instructions are issued to load cassettes from, or unload cassettes to a carrier at a predetermined address. A unique address is assigned to each of the carriers along a rotation direction in which the endless belt is rotated. In the preferred embodiment, the address preferably is data having a bit length in a range of 10 to 16 bits, and the address preferably is expressed using a binary value, for example. Loading is a motion to allow the carrier to support the articles, and unloading is a motion to take out the articles from the carrier using a hand.

Detection signals indicating detection of carriers are inputted from two photoelectric sensors s1, s2, to the station controller 26. Among the photoelectric sensors s1, s2, the photoelectric sensor s1 additionally inputs identification signals indicating identification of the carriers to the station controller 26. The travel displacement of the endless belt is inputted from an encoder enc to the station controller 26. The station controller 26 recognizes an appearance of a carrier at a predetermined position upstream of the station by the signal from the photoelectric sensor s1, and recognizes a type of the carrier, e.g., based on duration of the signal from the photoelectric sensor s1.

The data of the encoder when the carrier is detected by the photoelectric sensor s1 is latched. The difference from the latch value is considered, and the position of watching the photoelectric sensor s1 is regarded as a reference point to recognize the position of the carrier. Further, validity of the data of the encoder is checked by the photoelectric sensor s2 as described later. Based on the data of the encoder, a hand driver 27 is operated, and a hand 28 provided at the station is operated to load cassettes from, and unload cassettes to the carrier.

A dedicated hand to load articles and a dedicated hand to unload articles may be used. Alternatively, one hand may be used for both of loading and unloading. The hand 28 is an end effector of a transfer device, and any shape and structure can be adopted for the hand 28. For example, occupation sensors 29R, 29L are provided on both of left and right sides of the hand 28. In the case of loading a cassette on a carrier, it is checked whether the carrier supports another cassette or not. In the case of unloading a cassette from a carrier, it is checked whether any cassettes are loaded on the carrier or not. The hand 28 and the endless belt move at the same velocity. Since the hand 28 moves toward the carrier from a position on the front side of the carrier or from a position on the back side of the carrier, a pair of left and right occupation sensors 29R, 29L are used selectively depending on the direction in which the hand 28 moves toward the carrier.

Figure 3:
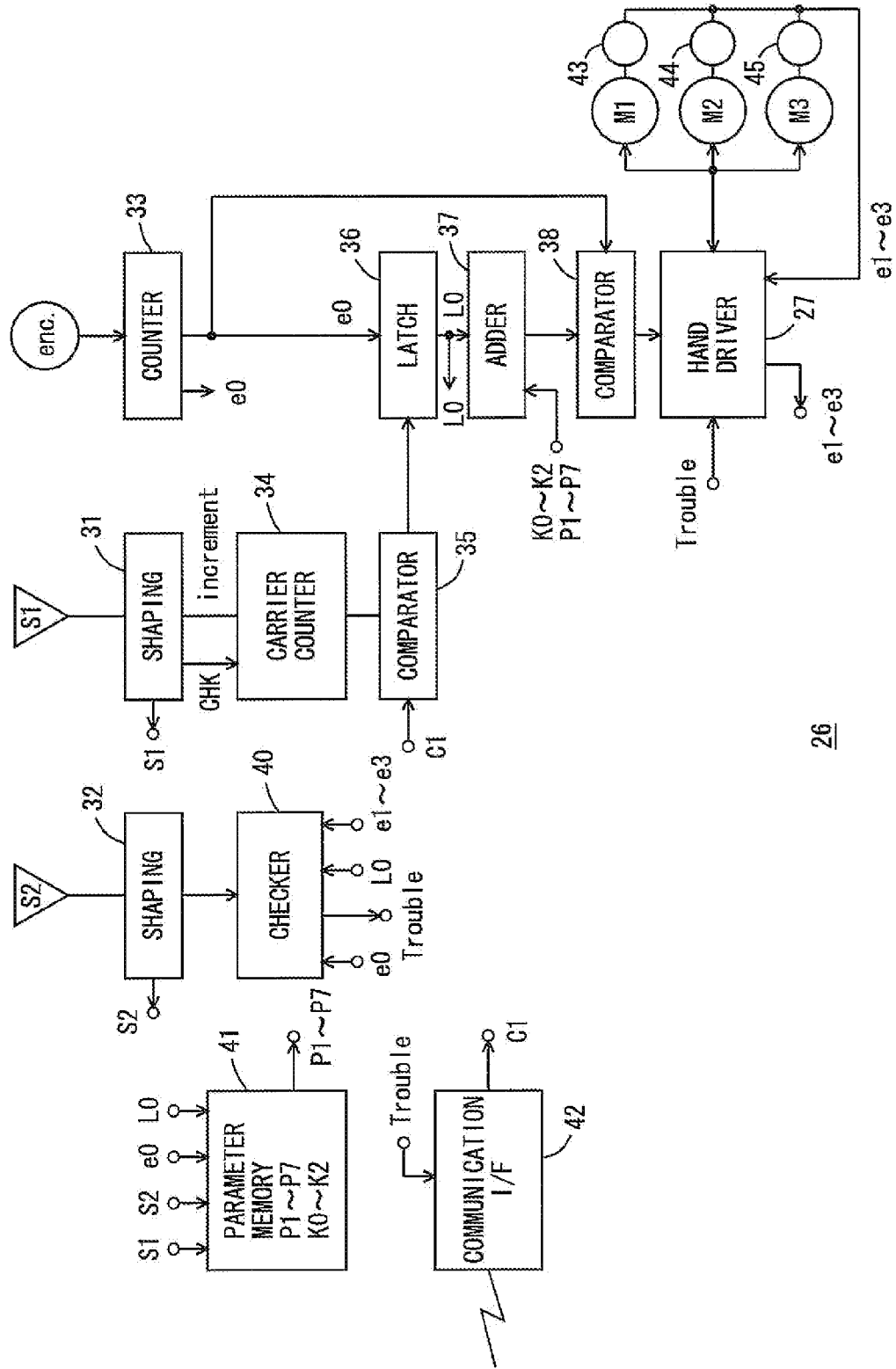
FIG. 3 is a block diagram showing a control system of a station in a preferred embodiment of the present invention.

FIG. 3 shows a structure of the station controller 26. Reference numerals 31, 32 denote shaping circuits. Shaping of signals from the sensors s1, s2 is performed, and a counter 33 counts the output pulses from the encoder. A reference numeral e0 denotes the output from the counter 33. A signal from a carrier counter 34 indicates an address of the carrier. In response to the detection signal indicating detection of the carrier from the sensor s1, the carrier counter 34 increments the carrier number by 1, and checks the validity of the value of the carrier counter 34 based on a check signal which appears at intervals of every eight sensors. If there is any error in the data of the carrier counter 34 for some reason, the check signal does not match the output from the carrier counter 34.

A comparator 35 compares the address of the carrier designated to perform loading or unloading of articles and the output from the carrier counter 34. If the address of the carrier matches the output from the carrier counter 34, the output from the counter 33 at this time point is stored in a latch 36. The output from the latch 36 is denoted by L0. The output from the counter 33 at the moment when the signal of the sensor s1 is turned on is stored. In the case where processing in the carrier counter 34 and the comparator 35 is slow, processing is modified to allow the latching operation to be performed at the rising edge of the output from the shaping circuit 31. A reference numeral 37 denotes an adder that adds calibrated transfer parameters K0 to K2, P1 to P7 stored in a parameter memory 41. When the comparator 38 determines that the signal from the adder 37 matches the signal from the counter 33, the hand is operated by the hand driver 27 accordingly.

In the present preferred embodiment, the hand is operated preferably by three motors M1, M2, and M3. Among these motors M1, M2, and M3, the motors M1, M2 are used to elevate or lower the hand in the height direction. The motor M3 is used to move the hand in the rotation direction in which the endless belt is rotated as indicated by an arrow Y. In the following description, it is assumed that height direction is a direction indicated by an arrow Z. In the present preferred embodiment, the hand is driven along two axes, i.e., in the Y direction and in the Z direction. Further, the hand may be driven additionally in a direction, e.g., indicated by an arrow X, i.e., to move along three axes. Moreover, numbers of rotations of the motors M1 to M3 are monitored by the encoders 43 to 45, and feedback control of the hand is implemented by the hand driver 27. The outputs from the encoders 43 to 45 are reset each time the hand returns to its home position after loading or unloading of articles is finished.

The signals from the latch 36 and the counter 33 are inputted to an encoder checker 40 to examine validity of the encoder enc. That is, the interval between the detection positions of the photoelectric sensor s1 and the photoelectric sensor s2 is known, and the number of output pulses of the encoder corresponding to this interval is stored in the parameter memory 41. The validity of the encoder enc can be checked based on whether the difference between the signal from the counter 33 at the time point when the sensor s2 is operated and the output from the latch 36 corresponds to the interval between the sensors s1, s2. Further, as described later, when the sensor s2 is operated, operation of the hand is started. If the hand is operated according to a target operating pattern, the outputs from the encoders 43 to 45 at this time point must be in a predetermined range. Therefore, operation of the hand is checked based on the signals from the encoders 43 to 45 when the sensor s2 is turned on. If there is any error (difference) greater than an allowable value or more in these items of data, a trouble signal Trouble is outputted from the checker 40, and operation of the hand is stopped.

A communication interface (I/F) 42 communicates with the material handling controller 22, and an address of a carrier which requires loading or unloading of cassettes, and a type indicating loading or unloading are inputted. Then, transportation results are transmitted from the communication interface 42 to the material handling controller 22. Further, the trouble signal Trouble is outputted from the checker 40. When the transfer operation is interrupted, information to this effect is reported to the material handling controller 22.

Figure 4:
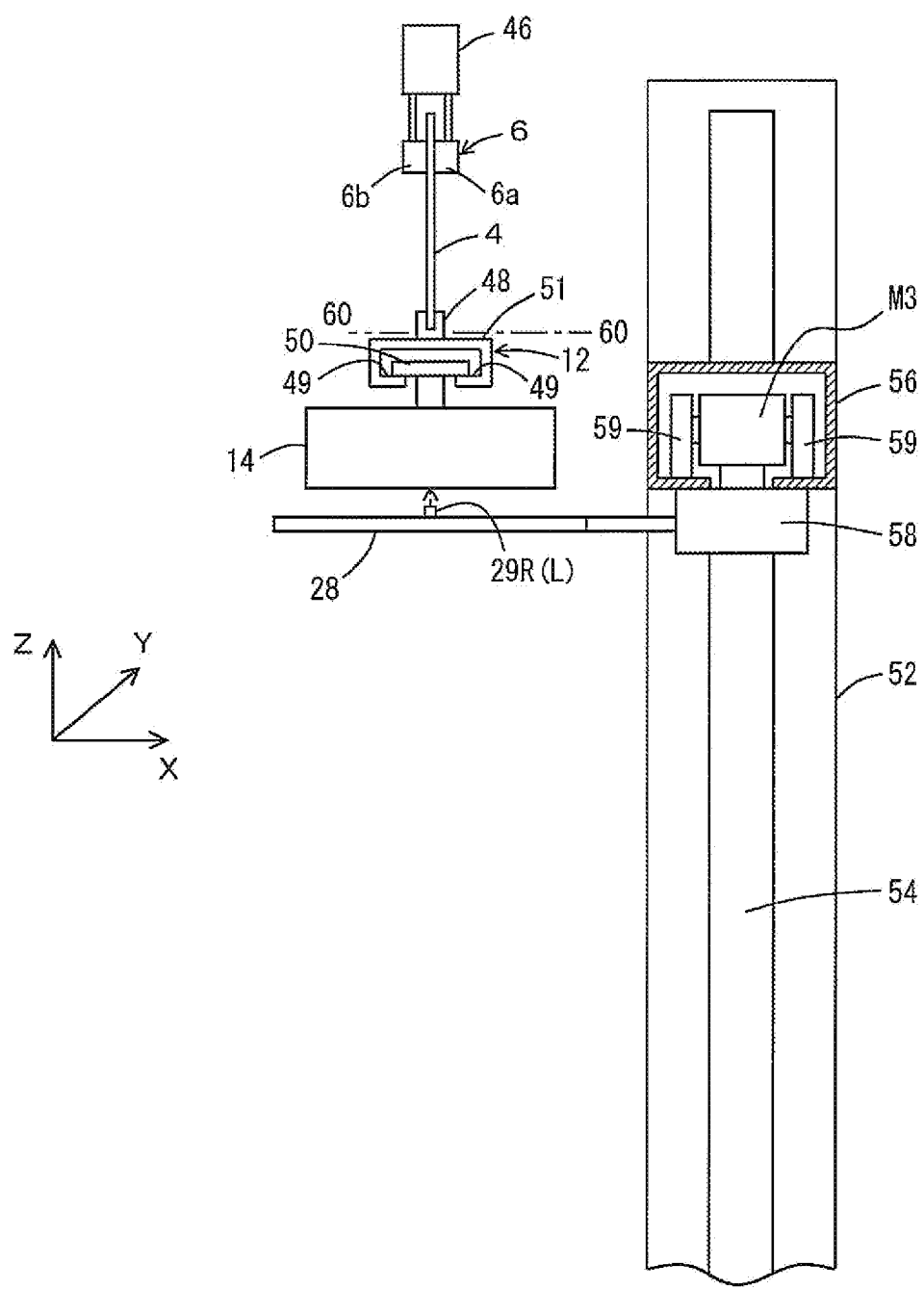
FIG. 4 is a side view showing main components of a carrier and a hand of the station in a preferred embodiment of the present invention.
Figure 5:
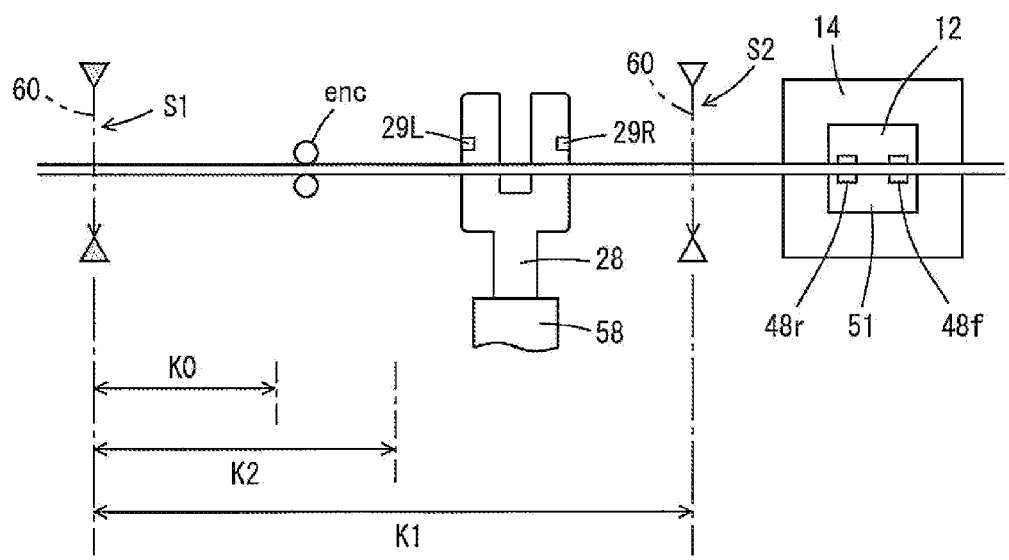
FIG. 5 is a plan view showing main components of the carrier and the hand of the station in a preferred embodiment of the present invention.
Figure 6:
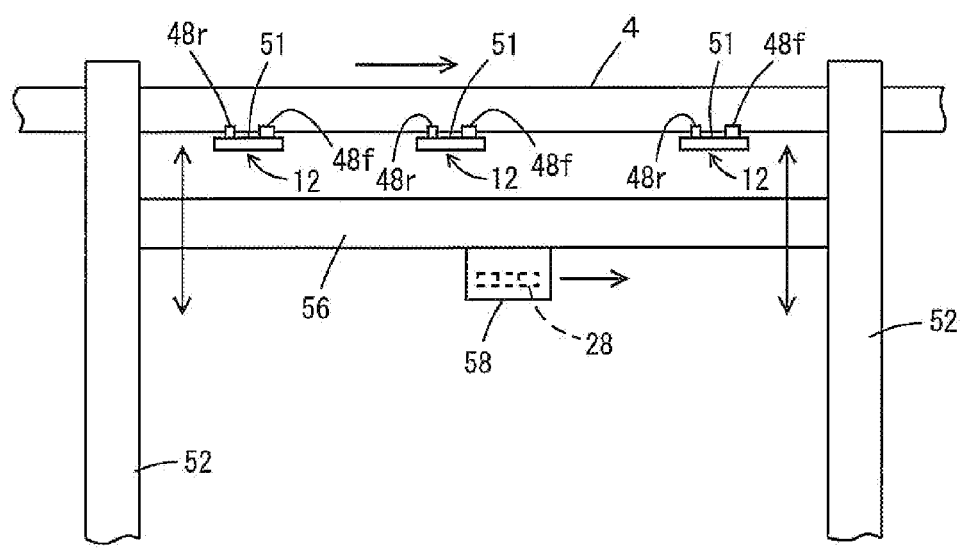
FIG. 6 is a rear view showing main components of the station in a preferred embodiment of the present invention.

FIGS. 4 to 6 show the relationship between the hand 28 and the endless belt 4 at the station 8. As shown in FIG. 4, it is assumed that the rotation direction of the belt 4 is the Y direction, the direction perpendicular to the Y direction in a horizontal plane is the X direction, and the height direction is the Z direction. Further, the hand 28 is operated in the Y direction and the Z direction. The pulley 6 is operated by a driving motor 46 or the like. The carrier 12 includes a pair of front and back attachments 48. Among the attachments 48, an attachment on the front side is denoted by a reference numeral 48$f$, and an attachment on the back side is denoted by a reference numeral 48$r$. The carrier 12 includes a carrier body 51 and the attachments 48. A gap between a lower end of the endless belt 4 and an upper end of the carrier body 51 is a watching line 60. At this height, the photoelectric sensors s1, s2 watch the attachments 48$f$, 48$r$. The flange 50 of the cassette 14 is placed on a supporting surface 49 of the carrier body 51. A pair of columns 52 are provided on both of left and right sides of the station 8. An elevating and lowering rail 56 is elevated and lowered along a guide groove 54 by motors M1, M2 (not shown). A motor M3 is provided at an upper portion of a hand base 58, and wheels 59 travel within the elevating and lowering rail 56 in the Y direction.

Figure 7:
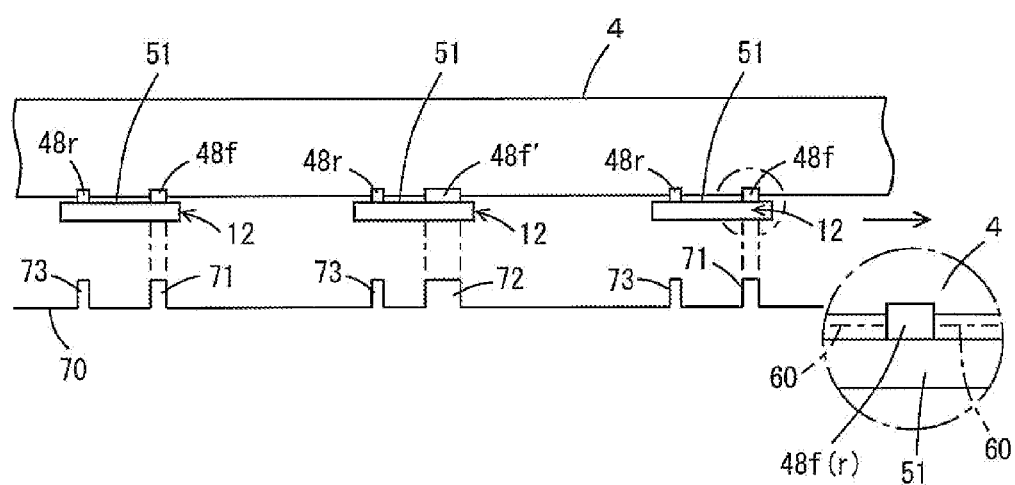
FIG. 7 is a view showing identification of a carrier in a preferred embodiment of the present invention.

FIG. 7 shows detection and identification of the carrier 12. It is assumed that the endless belt 4 travels from the left side to the right side in FIG. 7 at a constant velocity. The carrier 12 includes the attachment 48$f$ on the front side, and the attachment 48$r$ on the back side. The attachments 48$f$, 48$r$ have different widths along the travel direction of the belt 4. Further, for example, attachments 48$f'$ having a different width along the travel direction of the belt 4 are provided at intervals of every eight carriers. In this preferred embodiment, when the attachments 48$f$, 48$r$ are detected by the photoelectric sensor s1, a signal shown on the lower side in FIG. 7 is obtained. A reference numeral 70 denotes a baseline of detection signals, and reference numerals 71 to 73 denote the detection signals. Since the attachments 48$f$ and 48$r$ have different widths, the signals 71, 73 have different widths. Next, since the attachments 48$f$ and 48$f'$ have different widths, if the signals 71, 72 have different widths, and the attachment 48$f'$ can be detected. For example, the attachments 48$f'$ are provided at intervals of every eight carriers, the lower three bits of the address of the carrier 12 can be checked. As can be seen from an enlarged view at a lower right position in FIG. 7, the watching line 60 for the attachments 48$f$, 48$r$ or the like is positioned in a gap in the height direction between the lower end of the belt 4 and the carrier body 51.

Figure 8:
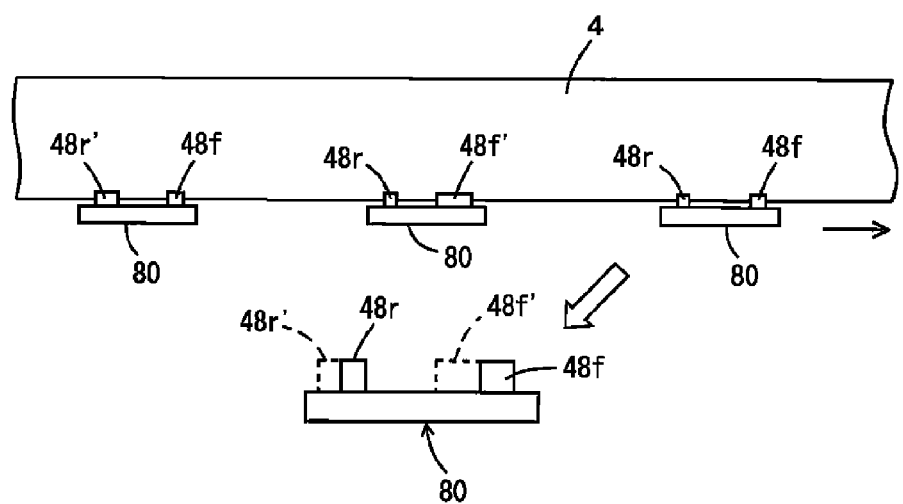
FIG. 8 is a view showing carriers in a modified preferred embodiment of the present invention.

FIG. 8 shows carriers 80 in a modified preferred embodiment. Two types of attachments 48$f$, 48$f'$ having different widths are provided on the front side of the carriers 80, and two types of attachments 48$r$, 48$r'$ having different widths 48$r$, 48$r'$ are provided on the back side of the carriers 80. Since the interval between the carriers 80 is larger than the interval between the attachments on the front and back sides, it is possible to identify which attachments are the attachments 48$f$, 48$f'$ on the front side and which attachments are the attachments 48$r$, 48$r'$ on the back side based on signals from the photoelectric sensor. In this manner, four types of carriers 80 can be identified, for example. By increasing the types of attachments to have three or more different widths, it becomes possible to further increase the number of identifiable types of carriers. In other respects, the carrier 80 of the modified preferred embodiment is the same as that of the preferred embodiment shown in FIGS. 1 to 7.

Figure 9:
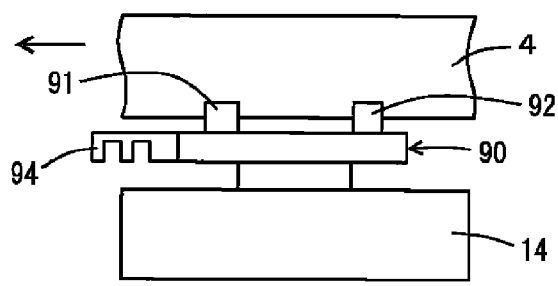
FIG. 9 is a view showing a carrier in a second modified preferred embodiment of the present invention.
Figure 10:
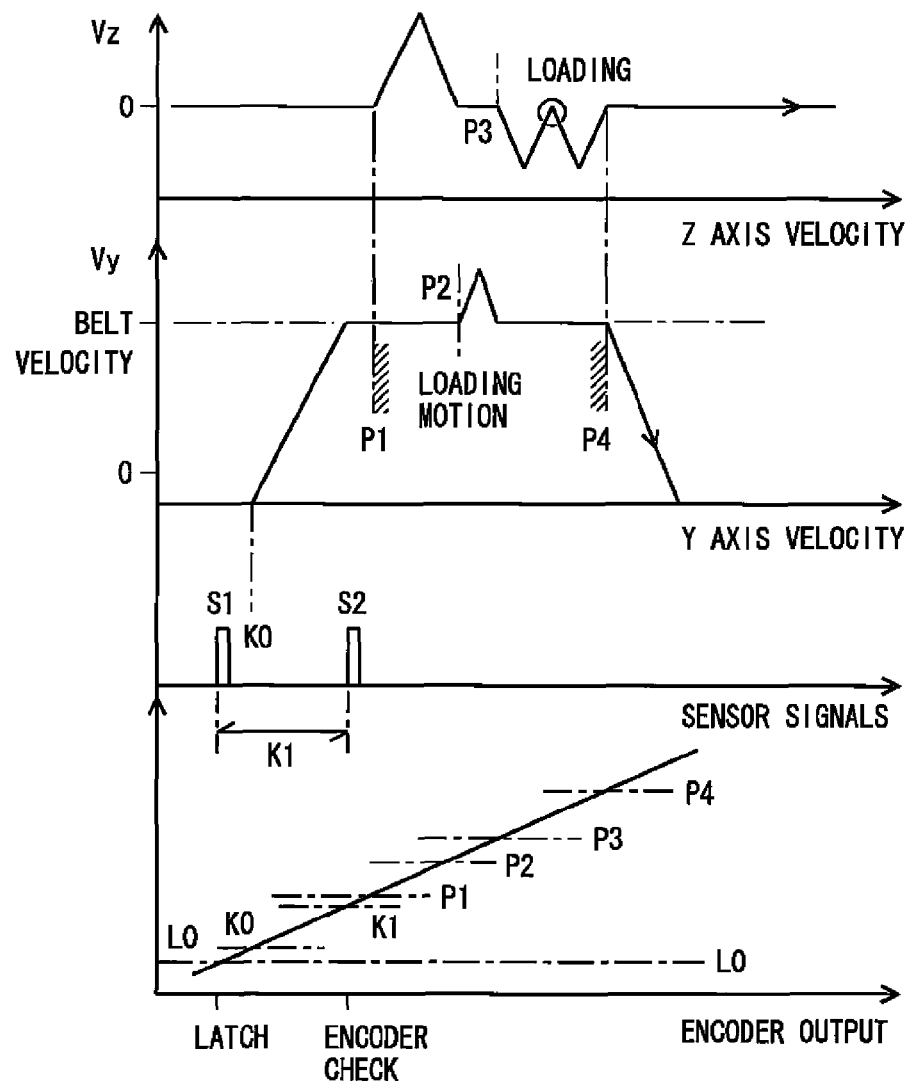
FIG. 10 is a timing chart at the time of loading in a preferred embodiment of the present invention.
Figure 11:
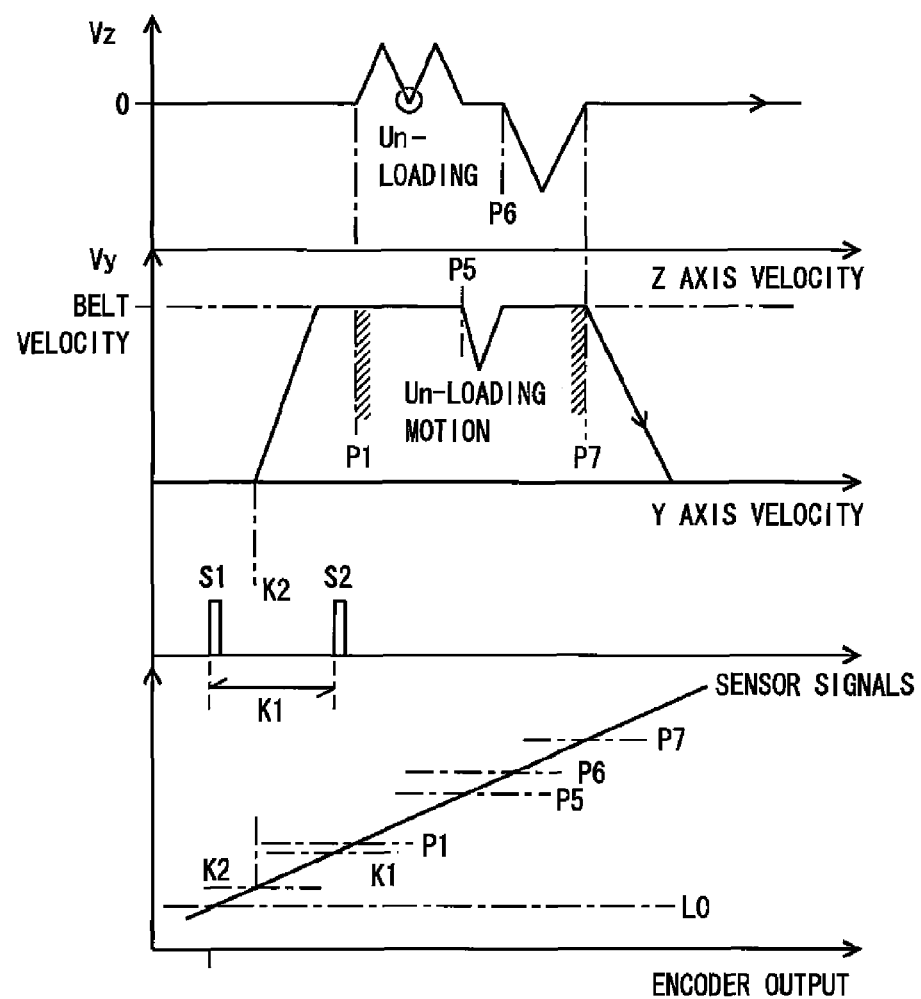
FIG. 11 is a timing chart at the time of unloading in a preferred embodiment of the present invention.

FIG. 9 shows a carrier 90 according to a second preferred embodiment. For example, an optical mark 94 is provided at a front end of the carrier 90 in the travel direction. The attachments 91, 92 are not used as targets of detection. The carrier 90 is detected, e.g., at the first edge of the optical mark 94, and the type of the carrier 90 is detected at the subsequent edge. Also in this approach, the type of the carrier can be identified using the photoelectric sensor without being obstructed by the cassettes 14. However, the optical mark is preferably provided in addition to the attachment. In other respects, the carrier 90 of the second modified preferred embodiment is the same as that of the preferred embodiment shown in FIGS. 1 to 7.

Figure 12:
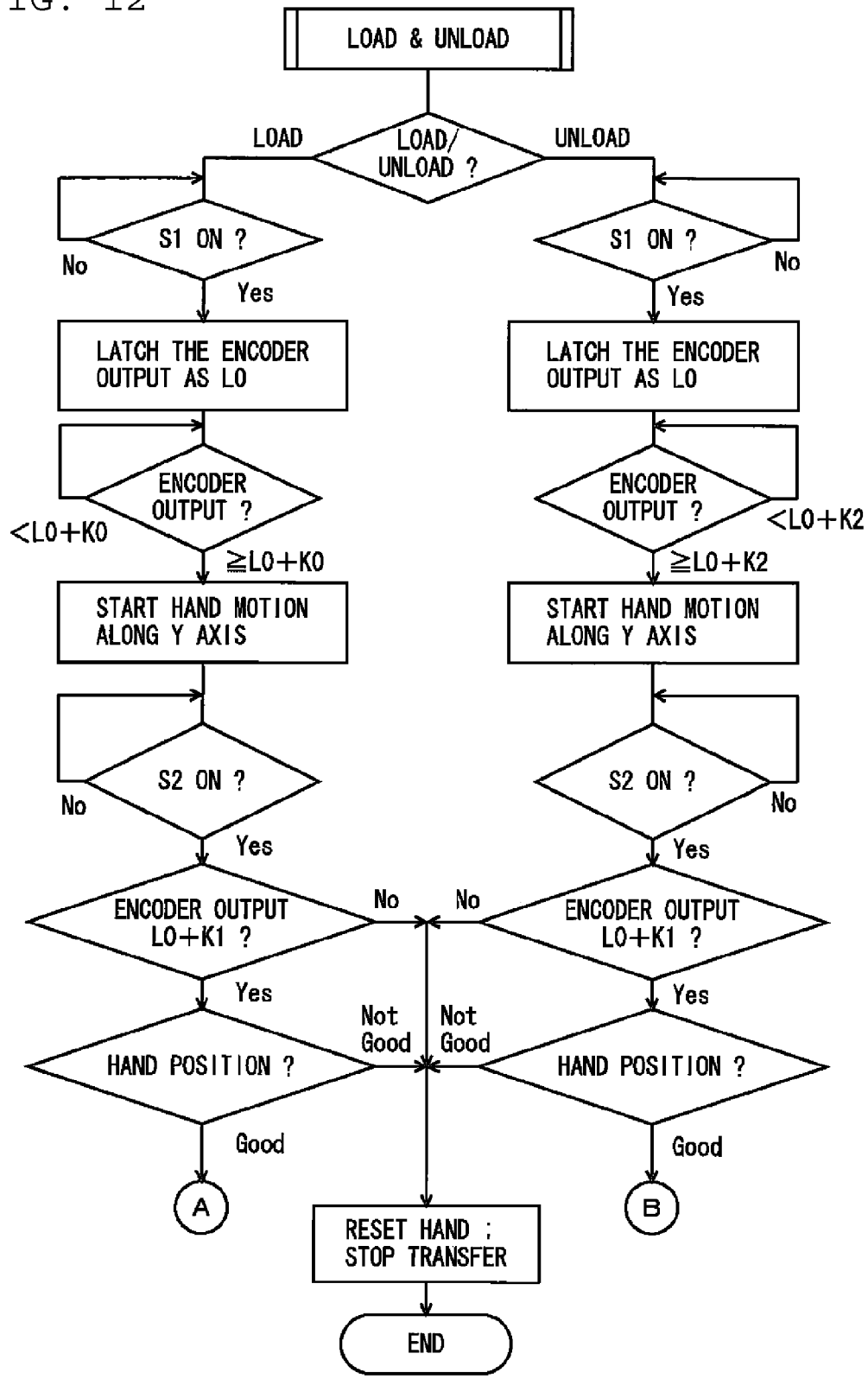
FIG. 12 is a flow chart showing the former half of an algorithm of loading and unloading in a preferred embodiment of the present invention.
Figure 13:
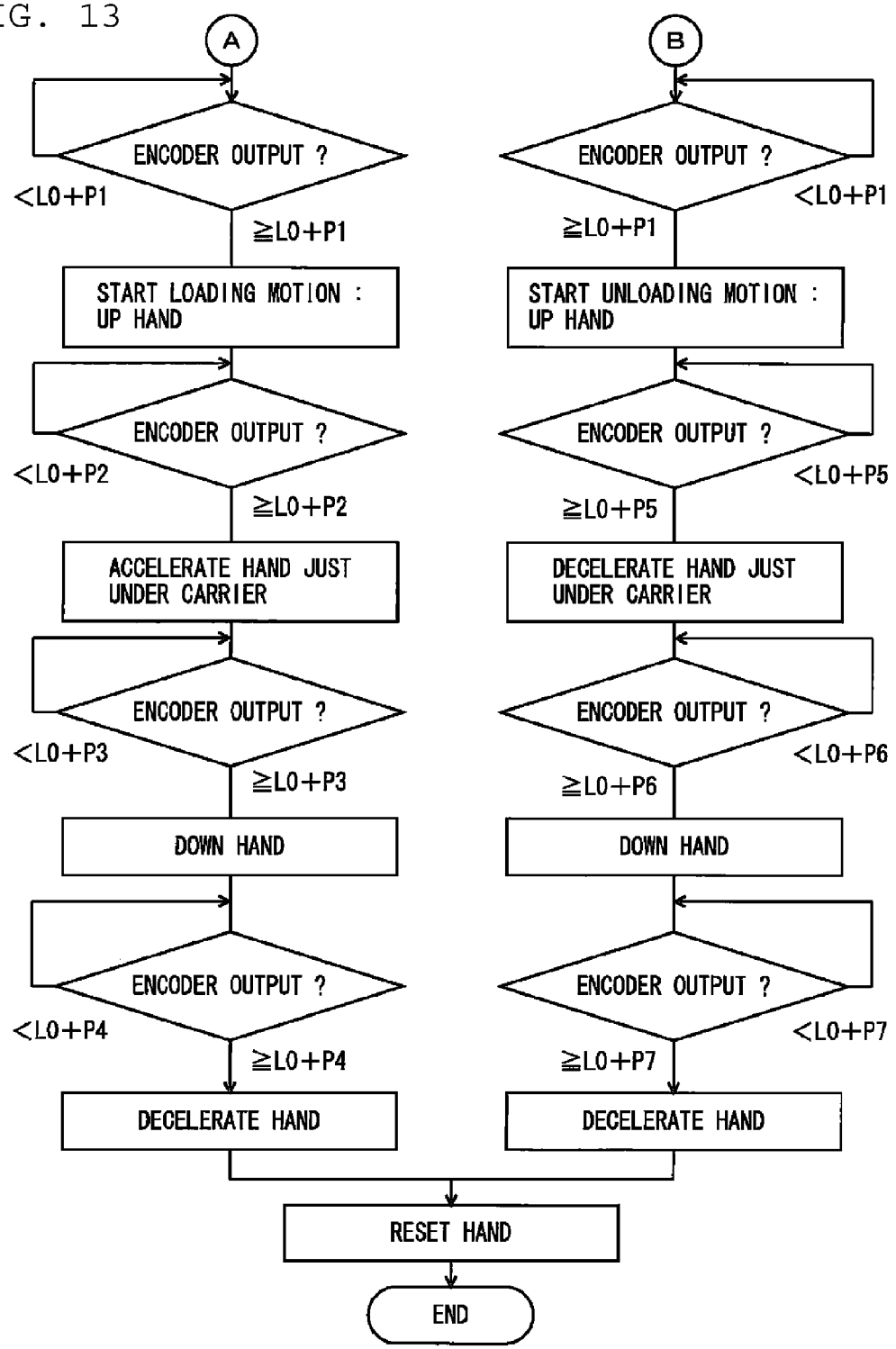
FIG. 13 is a flow chart showing the latter half of the algorithm of loading and unloading in a preferred embodiment of the present invention.

FIGS. 10 to 13 show a loading motion (FIG. 10) and an unloading motion (FIG. 11) according to a preferred embodiment, and an algorithm for performing the loading motion and the unloading motion (FIGS. 12 and 13). When the carrier is detected by the photoelectric sensor s1, the count value of the encoder output at this time point is latched. The latched output is denoted by a reference numeral L0. After latching, a preparation period is provided before starting operation of the hand. In the case of loading, a stand by period of K0 in terms of the number of pulses of the encoder's output is provided, and in the case of unloading, a stand by period of K2 in terms of the number of pulses is provided. Since acceleration at the time of loading is smaller than acceleration at the time of unloading, the number of pulses K0 is smaller than the number of pulses K2. As a result, loading motion and unloading motion as described later can be started at the same position relative to the station. Then, before turning on the photoelectric sensor s2, travel of the hand in the Y direction is started in both of loading and unloading.

At the time point when the photoelectric sensor s2 is turned on, the number of the encoder's output pulses after the photoelectric sensor s1 is turned on is determined, and this number is compared with a predetermined value K1. If the error (difference) from the predetermined value K1 is large, it is considered that sliding or the like occurs in the encoder, and transfer is stopped. Further, at the time point when the photoelectric sensor s2 is turned on, values of the encoders 43, for the driving motor of the hand are checked to confirm whether the hand is operated in accordance with a predetermined operating pattern. After the photoelectric sensor s2 is turned on, at the time when a number of output pulses common to both of loading and unloading is obtained, operation of elevating or lowering the hand is started. Loading motion or unloading motion herein means an operation from the start to the end of elevating or lowering the hand. The count value of the encoder's output pulses at the time of starting loading motion or unloading motion is larger than the latched value L0 by P1. P1 is common to both of loading and unloading. When the carrier comes to a position which is the same as the position of the station, loading motion or unloading motion is started. For this purpose, the area where unloading movement is performed and the area where loading movement is performed are substantially the same with respect to the station.

In the case of loading, the hand is elevated, and when the output value from the counter is increased by P2, the hand is accelerated in the Y direction. The hand and the carrier are overlapped with each other vertically along the Y direction. When the counter value of the encoder's output becomes L0+P3, the hand is started to be lowered. While the hand is being lowered, when the velocity in the Z direction becomes 0, the cassette is loaded from the hand to the carrier. When the counter value of the encoder's output becomes L0+L4, elevating and lowering operation of the hand is stopped, and the hand is decelerated along the Y direction to escape to the back side of the carrier. When the count value becomes L0+L7, the carrier returns to a predetermined position of the station.

In the case of unloading, elevation of the hand is started when the counter value of the encoder's output becomes L0+L1. While the hand is being elevated, the velocity in the Z direction is once regulated to zero. At this time point, the cassette is unloaded from the carrier to the hand. Then, when the count value becomes L0+P5, the hand is decelerated to escape to the back side of the carrier, and when the count value becomes L0+L6, the hand is lowered. Then, when the counter value becomes L0+L7, the carrier returns to a predetermined position of the station.

In the present preferred embodiment, the following advantages are obtained.

The validity of the address of the carrier can be checked using a photoelectric sensor for detection of the carrier.

By positioning the detection line at the height of a gap between the carrier body and the endless belt, the attachment for the carrier can be used also as a mark for identification. Further, the mark can be detected without being obstructed by the carrier body or the like.

Identification of the carrier is not obstructed by transported articles such as cassettes.

In the present preferred embodiment, though the photoelectric sensors and optical marks are preferably used in combination, magnetic marks may be used instead of the optical marks. In this case, for example, the magnetic mark may be attached to an upper portion of the carrier body, and the magnetic mark may be detected by the magnetic sensor to detect the position and the type of the carrier. Though the photoelectric sensors are preferably used in the present preferred embodiment, reflective type photoelectric sensors may be used. Further, alternatively, laser sensors or the like may be used.

DESCRIPTION OF REFERENCE NUMERALS

2: transport system
4: endless belt
6, 6a, 6b: pulley
8: station
10: processing tool
12: carrier
14: cassette
20: manufacturing execution controller
22: material handling controller
24: endless belt driver
26: station controller
27: hand driver
28: hand
29R, 29L: occupation sensor
31, 32: shaping circuit
33: counter
34: carrier counter
35: comparator
36: latch
37: adder
38: comparator
40: encoder checker
41: parameter memory
42: communication I/F
43 to 45: encoder
46: driving motor
48, 48f, 48r: attachment
49: supporting surface
50: flange
51: carrier body
52: column
54: guide groove
56: elevating and lowering rail
58: hand base
59: wheel
60: watching line
70: baseline
71 to 73: detection signal
80, 90: carrier
91, 92: attachment
94: optical mark
S1, s2: photoelectric sensor
enc: encoder
M1 to M3: motor
P1 to P7: parameter
K0 to K2: parameter While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport system comprising:
an endless driving medium configured to rotate in a circulating manner;
a plurality of carriers each including an identification target for carrier identification, configured to hold articles, and attached to the endless driving medium; and
a plurality of stations each including a hand configured to load articles to or unload articles from the carriers, and a sensor configured to detect the identification target at a predetermined position upstream of the hand along a rotation direction of the endless driving medium to output a detection signal of the carrier and an identification signal of the carrier; wherein
each of the identification targets of the plurality of carriers includes an attachment configured to attach the carrier to the endless driving medium; and
the attachments have different widths for the plurality of carriers along the rotation direction of the endless driving medium to perform identification of the carrier.

2. The transport system according to claim 1, wherein the transport system is configured to use the detection signal of the carrier as a timing signal to starting an unloading operation or an unloading operation of the hand.

3. The transport system according to claim 1, wherein the attachment is attached to a lower end of the endless driving medium, a carrier body of the carrier is provided below the attachment with a gap in a height direction between the lower end of the endless driving medium and the carrier body of the carrier, the sensor is configured to detect the attachment at a height position between the lower end of the endless driving medium and an upper portion of the carrier body.

4. The transport system according to claim 1, wherein an identification target different from other identification targets is provided for every predetermined number of carriers, and the carriers are detected by detecting a number of identification targets detected after detection of the different identification target.

5. A method of identifying a carrier in a transport system, the method comprising the steps of:
attaching a plurality of carriers each including an identification target and configured to hold articles for transportation, to an endless driving medium configured to rotate in a circulating manner;
providing a plurality of stations each including a hand configured to load articles to or unload articles from the carriers and a sensor configured to detect the identification target at a predetermined position upstream of the hand along a rotation direction of the endless driving medium; and
identifying a carrier and recognizing an appearance of the carrier at a predetermined position based on a signal from the sensor to operate the hand for a desired carrier; wherein
each of the identification targets of the plurality of carriers includes an attachment configured to attach the carrier to the endless driving medium; and
the attachments have different widths for the plurality of carriers along the rotation direction of the endless driving medium to perform identification of the carrier.

6. A carrier comprising:
a carrier body that supports an article; and
an attachment provided at an upper portion of the carrier body for attachment to an endless driving medium; wherein
the carrier is identifiable based on a width of the attachment along a moving direction of the endless driving medium; and
the width of the attachment along the moving direction of the endless driving medium is configured to be one of at least two different widths.

* * * * *